United States Patent

Rapaport et al.

[11] Patent Number: 5,986,550
[45] Date of Patent: Nov. 16, 1999

[54] METHOD FOR LABELING, VERIFICATION AND/OR IDENTIFYING AND DEVICE FOR IMPLEMENTING THE METHOD

[75] Inventors: Erich I. Rapaport, Tel Aviv; Yuri Rosenfeld, Yeroham; David Gill, Tel Aviv; Lev Goldfeld, Beer Sheva; Alexander Shames, Beer Sheva; Vladimir Lyandres, Beer Sheva, all of Israel

[73] Assignee: Micro Tag Temed Ltd., D.N. Arava, Israel

[21] Appl. No.: 08/776,889

[22] PCT Filed: Aug. 9, 1995

[86] PCT No.: PCT/EP95/03157

§ 371 Date: May 5, 1997

§ 102(e) Date: May 5, 1997

[87] PCT Pub. No.: WO96/05522

PCT Pub. Date: Feb. 22, 1996

[30] Foreign Application Priority Data

Aug. 9, 1994 [IL] Israel ......................................... 110597

[51] Int. Cl.⁶ .................................................. G08B 13/14
[52] U.S. Cl. ...................... 340/572.3; 235/380; 324/300; 340/572.5; 340/825.34
[58] Field of Search ............................... 340/572, 825.34, 340/572.5, 572.3, 572.1; 235/380, 382; 324/300, 307, 309, 316, 327

[56] References Cited

U.S. PATENT DOCUMENTS

| | | | |
|---|---|---|---|
| 4,376,264 | 3/1983 | Dokter et al. | 324/316 |
| 4,531,117 | 7/1985 | Nourse et al. | 340/572 |
| 4,578,654 | 3/1986 | Tait | 333/175 |
| 5,149,946 | 9/1992 | Jerome et al. | 324/300 X |
| 5,168,224 | 12/1992 | Maruizumi et al. | 324/300 |
| 5,175,499 | 12/1992 | Davies | 324/300 |
| 5,233,300 | 8/1993 | Buess et al. | 324/307 |
| 5,254,950 | 10/1993 | Fan et al. | 324/322 |
| 5,457,385 | 10/1995 | Sydney et al. | 324/301 |

FOREIGN PATENT DOCUMENTS

| | | |
|---|---|---|
| 0 096 182 | 12/1983 | European Pat. Off. . |
| 0426851 | 4/1990 | European Pat. Off. . |
| 0 399 563 | 11/1990 | European Pat. Off. . |
| 29 53 405 | 12/1987 | Germany . |
| 07769 | 8/1989 | WIPO . |
| 91/04503 | 4/1991 | WIPO . |
| 17793 | 10/1992 | WIPO . |
| 21987 | 12/1992 | WIPO . |
| 93/14474 | 7/1993 | WIPO . |

OTHER PUBLICATIONS

"Zero–filled NMR and NQR Spectrometer," by A. Bielecki et al., *Rev. Sci. Instrum.*, vol. 57, No. 3, Mar. 1986, pp. 393–402.

*Primary Examiner*—Thomas Mullen

[57] ABSTRACT

A method of labeling, authenticating and/or identifying a paper, credit/identification card, bank note, article or any other object using both nuclear magnetic resonance in magnetically ordered materials and nuclear quardrupole resonance phenomena as well as other phenomena of electric/magnetic dipole or tunnel transitions between Stark-Zeeman sub-levels, frequencies of which belong to the radio-frequency band. A minor amount of at least one authenticating substance is added to the object, the substance having a strong unique and identifiable response in radio-frequency domain at room temperature, with the spectroscopy being performed in the absence of any supported external static field, and with any specific response (intensity, line width, line shape, splittings, free induction decay, spin echoes or their combinations) being used as a criterion for discrimination.

43 Claims, 6 Drawing Sheets

METHOD FOR LABELING, VERIFICATION AND/OR IDENTIFYING AND DEVICE FOR IMPLEMENTING THE METHOD

FIELD OF THE INVENTION

The invention relates in general terms to the field of labeling, authenticating or identifying, and more particularly it relates to new methods of verifying the authenticity of objects and/or identifying them as well as electronic article surveillance (theft prevention etc.) and personnel verification; new instruments for implementing these methods; and new substances adapted to the corresponding methods and instruments. The term "substance" is used to cover any substance or composition of substances capable of being applied on the surface or into the bulk of an arbitrary object, locally or diffusely e. g. like an ink, dye, glue, powder, film, wire, foil or adhesive label.

BACKGROUND OF THE INVENTION

Numerous techniques are already known for authenticating papers of value, or the like, with the aid of spot reactions (Dutch patent application No. 6613250) or fluorescence (French Pat. No. 2,289,976; U.S. Pat. No. 4,146,792).

A variety of electronic surveillance of goods or personnel verification systems currently exists. They involve detection of macroscopic magnetic properties (U.S. Pat. No. 5,146,204) or macroscopic resonance associated with LC electrical circuit resonance (U.S. Pat. No. 4,870,391; Japanese Patent No. 4,800,369; Dutch Patent No. 5,068,641; U.S. Pat. No. 5,081,045; Dutch Patent NO. 5,051,727), or bulk mechanical vibration resonance, or nonlinear electrical transponders or high permeability magnetically saturated soft magnetic elements.

A first patent which claimed the application of electron paramagnetic resonance (EPR, also know as electron spin resonance—ESR) to the problems of authenticating or identifying papers of value was U.S. Pat. No. 4,376,264. It teaches the use of substances having EPR characteristics detected by high field EPR in microwave band (from 9 GHz). U.S. Pat. No. 5,149,946 claims the use of ESR in radio-frequency band for solving the same problem. U.S. Pat. No. 5,175,499 claims resolution of the authenticating problem with the help of such magnetic resonance phenomena as nuclear magnetic resonance (NMR), electron spin resonance (ESR), ferromagnetic resonance (FR), ferrimagnetic resonance (FER), antiferrimagnetic resonance (AFER), domain wall resonance (DWR), spin wave resonance (SWR), spin-echoes (SER).

All of the aforementioned patents are based on a variety of magnetic resonance phenomena. These phenomena are associated with nuclear, electron, atomic or molecular magnetic dipole moments acting individually or cooperatively in the presence of external magnetic fields to give nuclear magnetic resonance (NMR), electron spin/paramagnetic resonance (ESR, EPR), ferromagnetic resonance etc. The magnetic resonance is exhibited when the dipole moments precessing in the magnetic fields absorb and re-radiate microwave or radio-frequency electromagnetic radiation at or very close to the precession frequency. The serious disadvantage of applying aforementioned phenomena to the purposes of authenticating and/or identifying objects is necessity of an external static magnetic field for the excitation and detection of a resonance response. This magnetic field can be supplied either as a large field over the entire interrogation volume, or by a small permanent or semi-permanent magnet placed close to the resonant material and carried around with it and the object. For getting resonance responses with high sensitivity and high resolution the said field should be strong (about or more than 0.01 T) and homogeneous. These demands make both the marker/label and instrument design complicated. Further, the presence of a strong external magnetic field within the interrogation volume or near the marker runs the risk of health damage (pacemakers etc.) as well as the risk of wiping out data contained on magnetic media; all this makes it impossible for identifying credit or bank cards.

SUMMARY OF THE INVENTION

There are a variety of phenomena having the same microscopic nature as aforementioned magnetic resonance phenomena, but their macroscopic manifestation is absolutely different. First of all, they do not need any external static electrical or magnetic field (either within the interrogation zone or locally from a supporting substrate) for getting a detectable resonance response from radio-frequency or microwave irradiation. These phenomena can be classified as mixed electron-nuclear resonances in which the precession of nuclear electric or magnetic dipole moments is provoked by cooperative or individual electronic subsystem. Strong polarization of exchange coupled electron spins or gradient of electric field lead to the splittings of degenerate Stark-Zeeman sub levels between which a lot of allowed and "forbidden" transitions exists. The main distinctive feature of these resonances is the possibility of exciting a detectable resonance response in a resonant material (label, marker) exposed only to electromagnetic radiation at the resonance frequency. The presence of an external static electric or magnetic field (both within the whole interrogation volume and locally due to the magnetic material of the substrate) is not a necessary condition for receiving a detectable signal. In some cases the presence of the external field (which, for example, may be many times stronger than the Earth's magnetic field) may prevent the detection of the signal.

The phenomena of nuclear magnetic resonances (NMR) in magnetically ordered materials (ferromagnets, antiferromagnets, ferrimagnets) are associated with the splitting of nuclear Zeeman sub levels by a strong hyperfine field which is induced by magnetically ordered electron subsystem. The strong resonances are observed from both host and doped nuclei possessing non-zero nuclear magnetic moments such as 55Mn, 57Fe, 59Co etc. included into magnetically ordered metals, alloys, coordination or organic compounds. Every resonance frequency is unique for the chosen resonant substance and belongs to the radio-frequency waveband and, as a rule, are not greater than 1 GHz.

The phenomenon of nuclear quadrupole resonance (NQR) is associated with the splitting of nuclear sub levels by the gradient of electric field which is induced by molecular electrons. This resonance is observed in both host and doped nuclei possessing non-zero quadrupole nuclear moment such as 11B, 35Cl, 75As, 79,81Br, 127I etc. The observed resonance frequencies are the same as in the previous paragraph.

A lot of resonances dealing with different dipole and tunnel transition between degenerate Stark-Zeeman sub levels also show strong responses after excitation in the radio-frequency or the microwave band in the absence of any external static field. Typical substances demonstrating such resonances are the large class of coordination compounds with mixed valence or so-called Jahn-Teller crystals.

For convenience, the term "zero external static field radio-frequency resonance" will be used herein to include all of these magnetic and spin phenomena. The term "zero external field" being applied to aforementioned resonances implies herein that such resonances can be observed in the absence of any external static field or at very weak external static field like the Earth's magnetic field (0.5 mT). The weak field is not necessary for the resonance effect but also does not prevent the effect. The term "radio-frequencies" covers herein the electromagnetic frequency band from 1 MHz to 1 GHz. The term "room temperature" covers herein the temperature range of common working conditions both below and above 0° C. which does not require special cooling to cryogenic temperatures or heating to high ones.

From the point of view of its technical implementation the phenomenon of very low field electron spin resonance (VLF ESR) is very close to named zero-field resonances. Newly developed paramagnetic substances such as ion-radical salts, lithium phthalocyanin or gamma-irradiated fused quartz gave the possibility to observe ESR at very low external magnetic fields (about 1 mT and less) with sufficient sensitivity. It means that an instrument includes only means for scanning and modulation of the Earth's magnetic field to reach the point of resonance but not for generation of static supported field. This feature is the main distinctive difference from the methods and instruments which were claimed in cited U.S. Pat. No. 5,149,946 and No. 5,175,499. This effect is also observed in radio-frequency waveband.

Substances exhibiting zero-field resonance phenomena described above can be used in accordance with this invention for object labeling, authenticating and/or identifying and applied to anti-forgery, anti-pilferage or security surveillance. Such use is possible because they can have extremely strong, unique and well defined resonances in radio frequency domain at room temperature, with the spectroscopy being performed in the absence of any artificial external static fields, and with any specific response being used as a criterion of discrimination. These responses may be used to indicate the presence or identity of the labeled object. This can be achieved in a preferred embodiment of the invention by the use of a radio-frequency interrogation system which also detects an increase in the absorption of the interrogating electromagnetic energy or re-emission of electromagnetic energy by a labeling substance at the resonance frequency.

According to the first aspect of this invention, there is provided a method of labeling, authenticating and/or identifying an object using zero external static field radio-frequency resonance phenomena where said phenomenon is either nuclear magnetic resonance in ferromagnets, or antiferromagnets, or ferrimagnets, or nuclear quadrupole resonance, or very low field electron spin resonance, or said resonance phenomenon is due to electric/magnetic dipole or tunnel transitions between Stark-Zeeman sub levels, or any combinations or aforementioned phenomena.

According to the second aspect of this invention the aforementioned effects take place in ferromagnetic metals, alloys, coordination or organic compound including at least one type of nuclei with non-zero nuclear spin, or antiferromagnetic ones including at least one type of nuclei with non-zero nuclear spin, or ferrimagnetic ones including at least one type of nuclei with non-zero nuclear spin, or metals, alloys, coordination or organic compound including at least one type of nuclei with non-zero electric quadrupole moment, or organic radical compound like nitroxides, recrystallized diphenylpicryl hydrazyl, ion-radical salts, lithium phthalocianin, or gamma-irradiated fused quartz, or inorganic salt or coordination compound including paramagnetic ions of transition or rare earth groups, or coordination compound with mixed valence, or so-called Jahn-Teller crystals wherein all mentioned substances may be in the form of crystalline solid, polycrystalline solid, amorphous solid, wire, foil, liquid.

According to the third aspect of this invention, a substance capable of being applied to the object locally or a diffusion alloy, outside or inside the object in the form of ink, dye, glue, film, wire, foil, any adhesive label, is used for authenticating and/or identifying of papers of values, documents, bank notes, checks, credit cards, bank cards, identification cards, tags, keys, diskettes, and also are used for electronic article surveillance (theft prevention in shops, stores, libraries etc.) and personnel verification, or for security or custom surveillance when the labeled object represents jewelry, an explosive, a firearm or a drug.

According to the fourth aspect of this invention the instruments for implementing of the presented method for authenticating and/or identifying of papers of value, documents, bank notes, checks, credit cards, bank cards, identification cards, tags, keys, diskettes, comprise a systems generating either continuous or pulse, either modulated or non modulated emitted radiation in the radio frequency band, including a generator of continuous or pulse modulated or non modulated radio frequency signal and an emitting probe head or coil, transforming it into electromagnetic radiation, and a system for detection of the re-radiation emitted by the resonant substance in response to the radio frequency radiation, including receiving probe head or coil and detection device with a registration device determining presence of the re-radiation from the resonant substance. In some of these instruments the same probe head or coil is used for emitting of the radiated signal as well as for receiving of reradiation of the resonant substance. For electronic article surveillance (theft prevention in shops, stores, libraries, etc) and personnel verification, or for security or customs surveillance when the labeled object represents jewelry, an explosive, a firearm or drug, the instruments for implementing of the presented method are built as aforementioned system, wherein gates located at a point of control in shop, store, library, post office, airport or custom office are used instead of a probe head or coil.

According to the fifth aspect of this invention the proposed method can be used for detection of the labeled object (for example, electronic article surveillance), if a single one resonant substance label is used, or for identification/recognition of the labeled object if a plurality of readable markers are produced by a single one resonant substance, spatially disposed in a well determined manner like a bar code, strip code etc. Identification of the labeled object is realized also if a plurality of resonant substances comprising marker provides a set of well resolved responses in frequency or time domains. The proposed identification marker containing a plurality of resonant substances or locally distributed single resonant substance are used together with other data storage methods (magnetic or optic recording etc.) providing a means (key word or key number) for decoding information recorded by these methods.

According to the sixth aspect of this invention labeling of the object for authenticating and/or identifying is achieved by introducing of the resonant substance in the form of ink, dye, glue or other liquid substance before printing on the surface of the labeled object (bank notes, documents, tags etc.), or into the bulk of the labeled object (paper, plastic, explosive or any package material) during its production or packaging. The substance is introduced locally or diffusely in special adhesive label, and for destroying prevention may be visually masked if it is necessary.

According to the seventh aspect of this invention the resonant substance used for the object labeling is neutralized if it is necessary (for example in anti-theft application) by alternation of physical properties of the substance (for example, by magnetizing, heating etc.) or by alternation of chemical properties of the substance (for example, by oxidation, reduction etc.) or by electromagnetic screening of the resonant substance, or by removing the resonant substance together with supported tag, adhesive label etc. (for example by mechanical removal or by evaporation of the resonant substance together with supported tag by its local heating.

According to the eighth aspect of this invention zero external static field radio-frequency resonance phenomena are used for the amplification of LC electrical circuit resonance applied for electronic article surveillance systems which currently exist, by producing the said LC circuit from the resonant substance with the same resonance frequency, or by covering or adjusting of the said LC circuit with the resonant substance with the same resonance frequency.

According to the ninth aspect of this invention, for protection of the authenticating and/or identifying system, masking of the system resonant frequencies by emission of electromagnetic radiation at random frequencies including the working resonance is used, and for secrecy providing of resonant properties of the labeling substance the latter is placed together with any deactivation substance acting in the case of any unauthorized access to the said substance (for example, by strong oxidation in the air etc.).

BRIEF DESCRIPTION OF THE DRAWINGS

For better understanding of the present invention, the preferred embodiments will now be described by way of examples, with reference to the accompanying drawings in which.

DETAILED DESCRIPTION

Figure 1A:
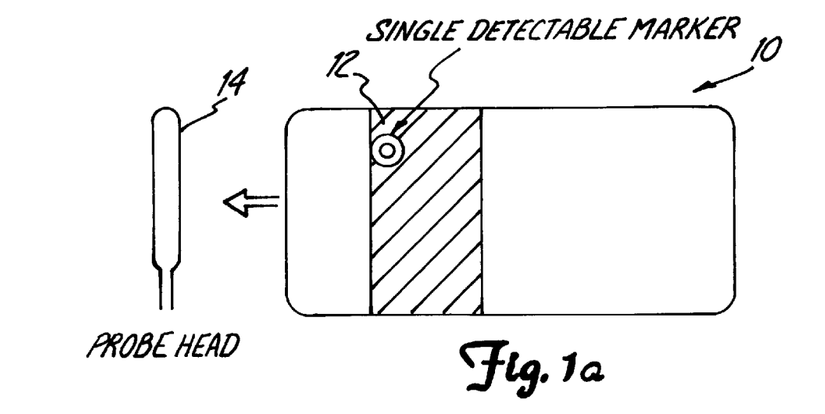
FIGS. 1a, 1b show examples of configurations of a detectable marker, single and spatially disposed respectively (bar code).
Figure 1B:
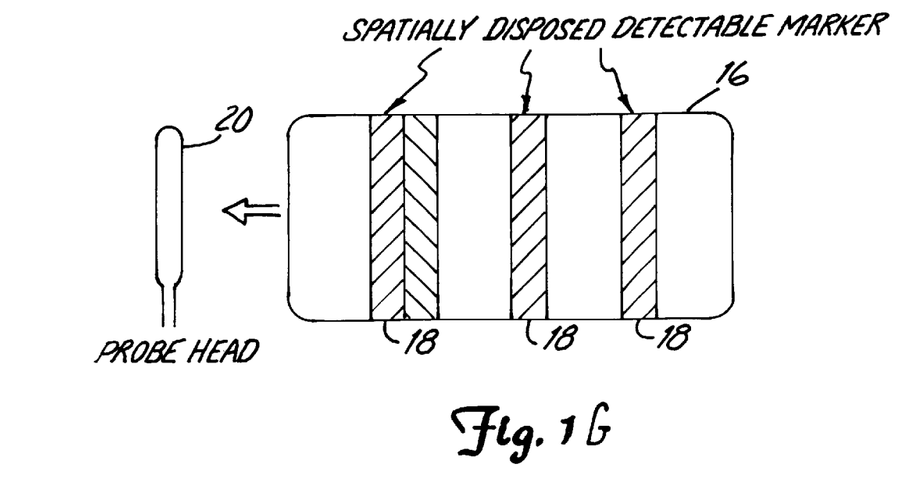

Referring first to FIGS. 1a and 1b two examples of possible configuration of a detectable marker or label are shown. In FIG. 1a a label 10 with spot concentrated resonant substance 12 is shown. Such labels 10 are used in simple detection systems (for example, in any paper verification). If the labeled object is moved through probe head 14 the re-radiation signal from resonant substance is detected and so authentication of the labeled object is performed. In FIG. 1b a label 16 with a spatially disposed resonant substance 18 like bar code is shown.

Such labels 10,16 are used in the systems of object identification (for example in systems of identification of credit cards). If the labeled object is moved through probe head 20 the re-radiation signals from every stripe of bar code are read separately and so registration of the code and identification of the object is performed.

Figure 2:
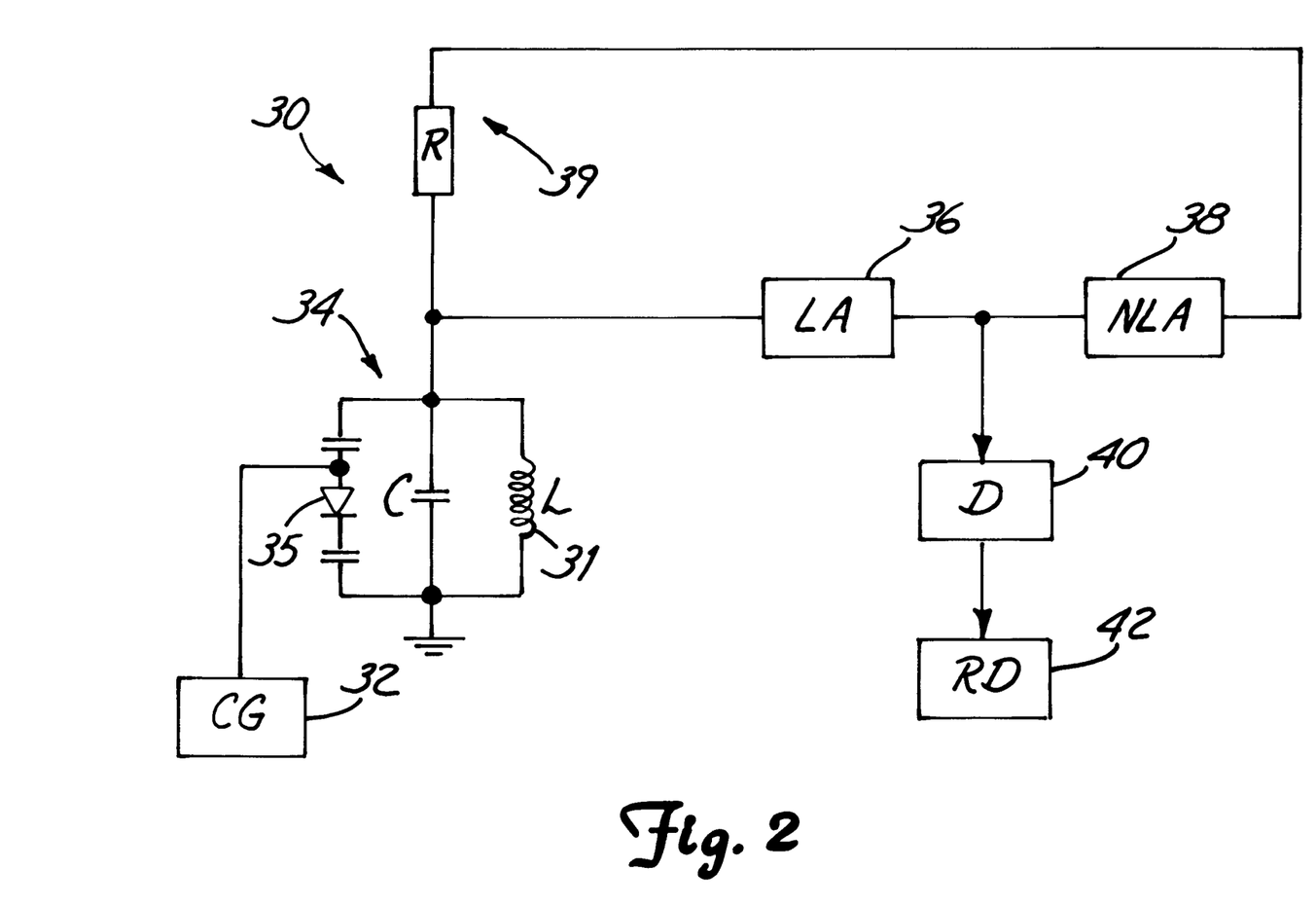
FIG. 2 shows schematically identification and/or authentication continuous wave performance system for use with an object, label or marker including a resonant substance.

FIG. 2 shows schematic example of continuous wave identification and/or authentication system 30 using a label including any resonant substance. Referring to FIG. 2 , CG represents generator 32 performing control of the resonant frequency of LC circuit. LA represents linear amplifier 36 of the signal at resonance frequency. NLA represents non-linear amplifier 38 limiting amplitude of the signal. D represents detector 40 and RD represents registration device 42. The device 42 records absorption of electromagnetic radiation by resonant substance.

Figure 3:
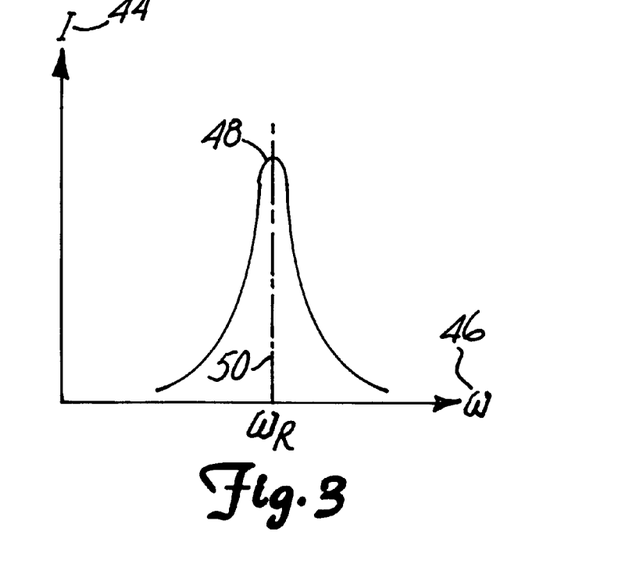
FIG. 3 shows a graph of the dependence of electromagnetic field absorption intensity on frequency applied to the labeled object.

FIG. 3 shows a graph of the dependence of electromagnetic field absorption intensity 44 upon the frequency 46 to the applied electromagnetic radiation. The graph magnitude 48 represents maximal level of absorption of electromagnetic field, the horizonal axis shows frequency 46, wr is the resonance frequency 50 of the corresponding substance.

Figure 4:
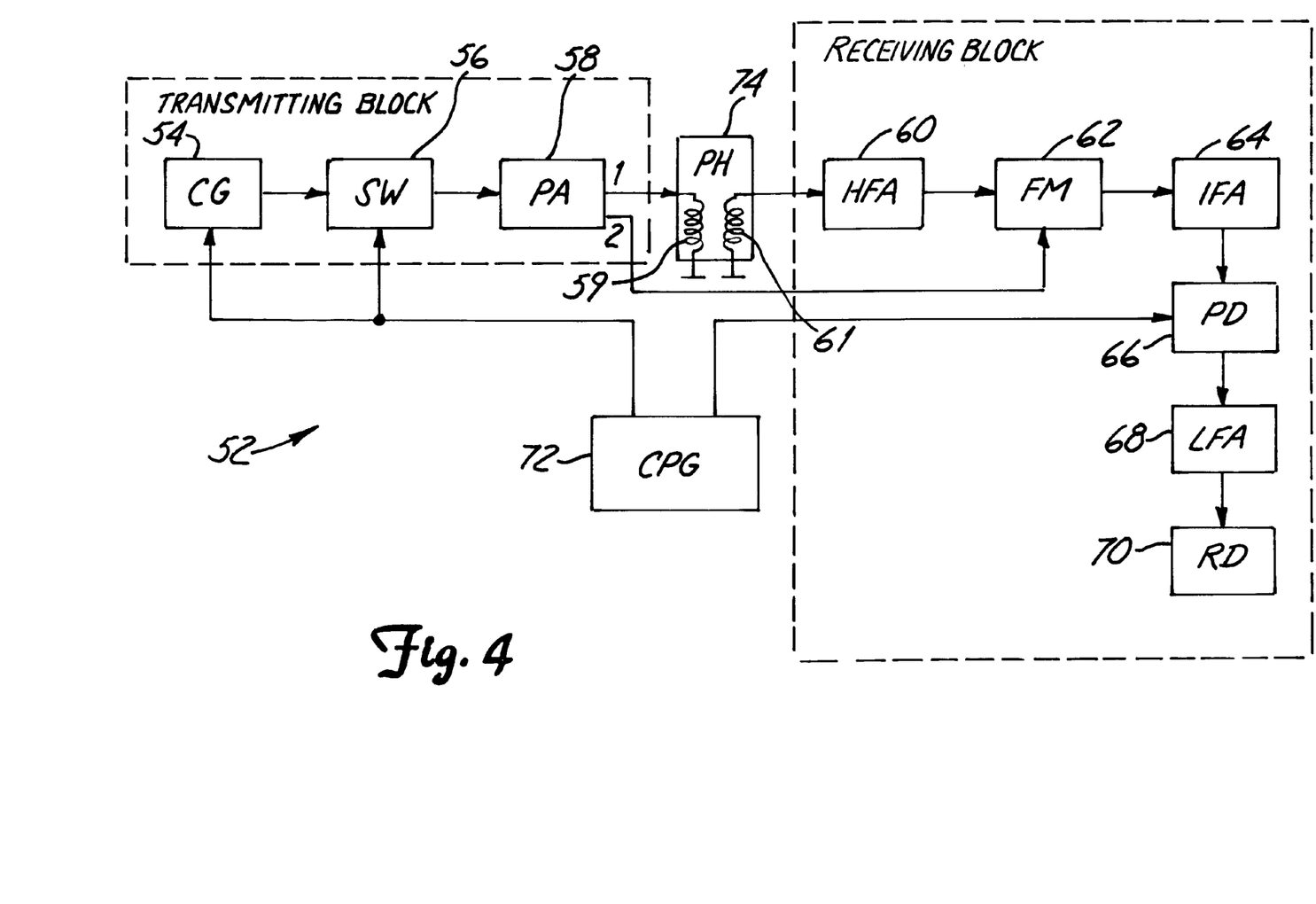
FIG. 4 shows schematically an identification and/or authentication pulse performance system using re-radiating label with registration of a Free Induction Decay (FID) signal.

FIG. 4 shows schematically an example of identification and/or authentication pulse performance system 52 using a re-radiating label with registration of an FID signal. Referring to FIG. 4, CG represents controlled generator 54, SW represents electronic switch 56, PA represents a power amplifier 58, HFA represent high frequency amplifier 60, FM represents frequency mixer 62, IFA represents intermediate frequency amplifier 64, PD represent phase detector 66, LFA represents a low frequency amplifier 68, RD represents registration device 70, CPG represents pulse generator 72, PH represents probe head 74.

Figure 5:
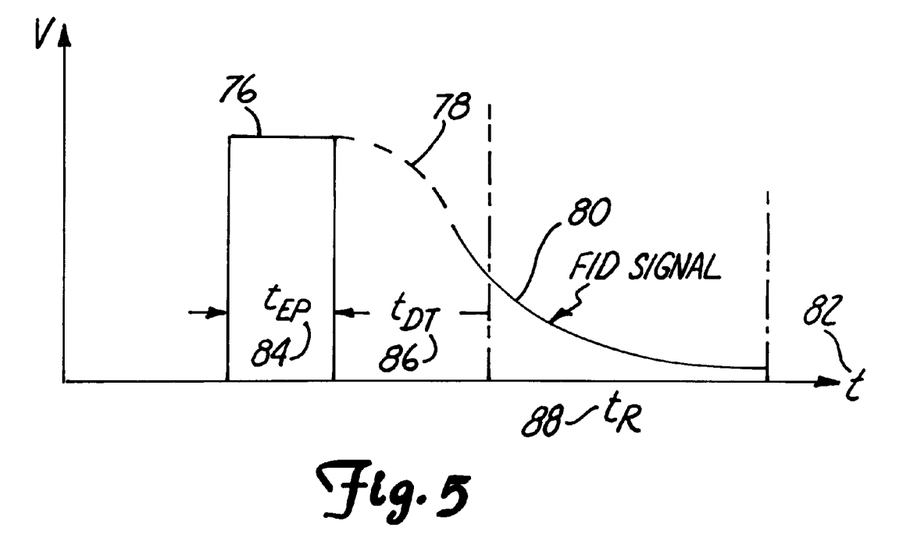
FIG. 5 shows a schematic time diagram of the exciting and FID signals.

FIG. 5 shows a schematic diagram of the exciting 76 and FID 78 signals. The rectangular pulse 76 represents the envelope of the exciting high frequency signal, the decayed line represents FID signal 78, and the solid line represents envelope of the recorded signal 80, the horizontal axis shows time 82, tEP represents length of the exciting pulse 84, tDT represents time interval (dead time) 86, where registration of FID signal is impossible due transient processes, tR is an interval 88 of the FID signal registration.

Figure 6:
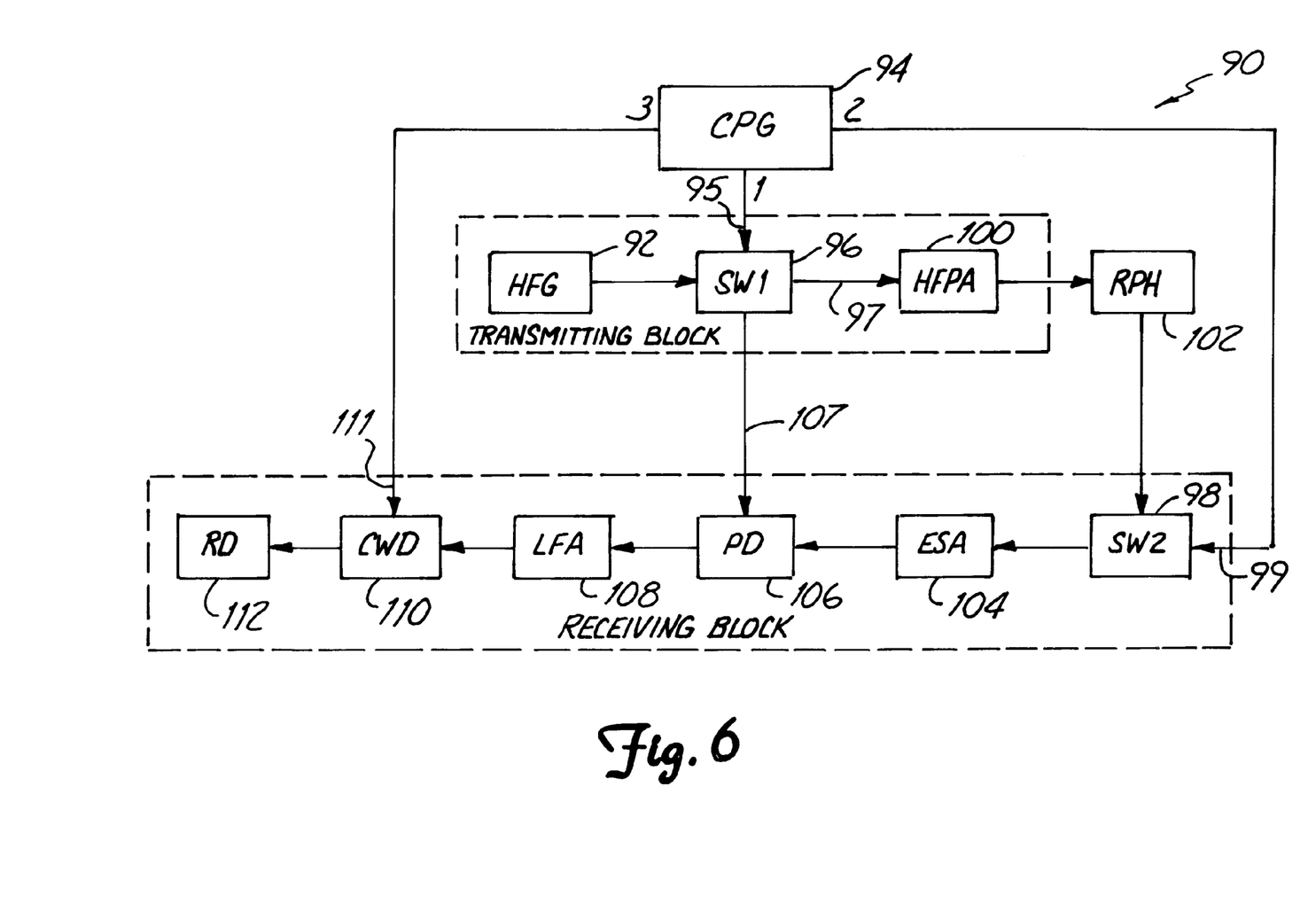
FIG. 6 shows schematically an identification and/or authentication pulse performance system using re-radiating label with registration of a Spin Echo Signal (SES).

FIG. 6 shows schematically the example of identification and/or authentication pulse performance system 90 using a re-radiating label with registration of a Spin Echo Signal (SES). HFG represents high frequency generator 92, CPG represents control pulse generator 94, SW1 (96) and SW2 (98) represent electronic switches, HFPA represents a high frequency pulse amplifier 100, RPH represents resonant probe head 102, ESA represents echo-signals amplifier 104, PD represents a phase detector 106, LFA represents low frequency amplifier 108, CWD represents detector with controlled window 110, RD represents registration device 112.

Figure 7:
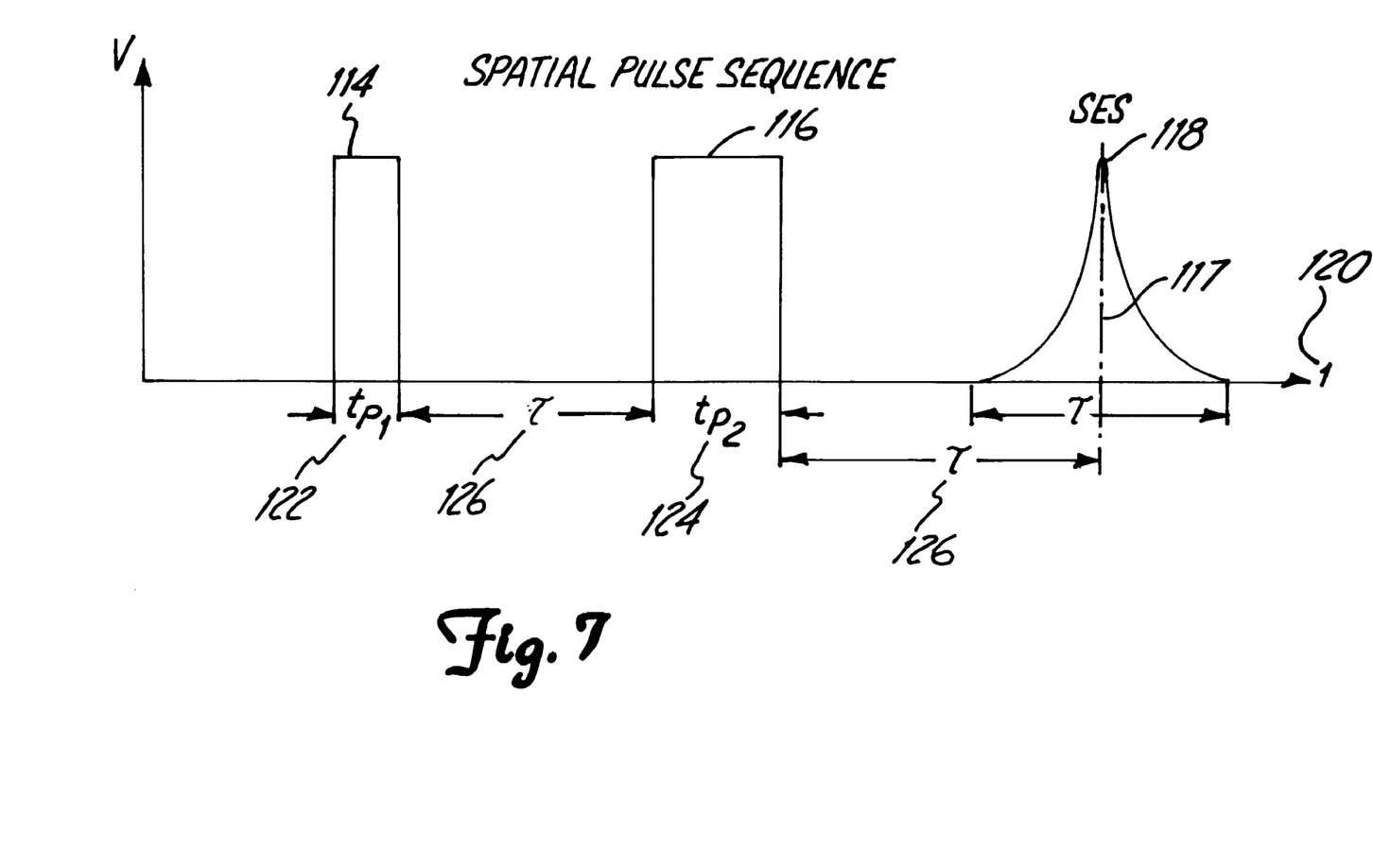
FIG. 7 shows a schematic time diagram of the exciting pulses and SES.

FIG. 7 shows a schematic diagram of the exciting pulses 114,116 and SES 118. The Sequence of rectangular pulses 114,116 represents the envelope of exciting signal, dotted line 117 represents envelope of FID signal, triangular pulse 118 represents spin echo signal ,the horizontal axis shows time 120, tP1 represents time length 122 of the first exciting pulse, tP2 represents time length 124 of the second exciting pulse, t represents an interval between exciting pulses 126 as well as between the last exciting pulse and the maximum of the spin echo signal. The value of t should be less then the value of transversal relaxation time T2 for the electron or nucleus in chosen resonant substance.

The invention will be illustrated further in non-limiting fashion by the following Examples.

EXAMPLE 1

This example describes the construction of continuous wave identification and/or authentication system using label including resonant substance. The system (FIG. 2) represents a voltage radio frequency generator including controlled LC circuit 34, sequentially connected LA (36), NLA (38), from which output signal through feedback circuit 39 including balance resistor R enters the input of LA. The resonance frequency of LC circuit 34 linearly changes in the fixed range with help of varicond 34 under control of pulses from output of CG 32. The output of LA 36 is connected also with RD 42 through D 40. If the label with resonant substance is brought in the coil 31 of LC 34, the quality factor of LC decreases. As is clear from FIG. 3 at the frequency 50 equal to the resonant frequency of the label substance, intensity of the electromagnetic field absorption achieves maximum 48, the quality factor of LC circuit decreases abruptly and generation is interrupted. This fact is registered by two connected blocks D 40, RD 42 and in such a way detection of the labeled object is performed.

EXAMPLE 2

This example describes the construction of identification and/or authentication pulse performance system using re-radiating label with the registration of FID signal. In this example a powdered sample (average particle diameter d is about 2 $\mu$m) of manganese ferrite ($MnFe_2O_4$) was chosen as a resonant substance. The resonance frequency is 536 MHz at Earth's magnetic field and room temperature (300° K.+\−20° K.). The label was designed according to FIG. 1a. About 200 mg of resonant substance was concentrated in a 3 mm×20 mm×0.5 mm strip included into the bulk of plastic bank card. The probe head (PH) 74 is a circular surface coil designed as a single turn of 14 mm in diameter wound from 2 mm copper wire, tuned to resonance frequency and matched to 50 $\Omega$. Referring to FIG. 4 the system includes transmitting block consisting of sequentially connected CG 54 and SW 56, of which the first output 1 is connected through PA 58 with radiation coil of PH 74, and the second output 2 of SW is connected with the FM control input of receiving block consisting of the sequentially connected receiving coil of PH 74, HFA 60, FM 62, IFA 64, PD 66, LFA 68 and RD 70, and also control pulse generator CPG 72, connected with FM control inputs of CG 54, SW 56 and PD 66. During absence of the control pulse from CPG output, CG 54 produces voltage oscillations with the frequency f0=536 MHz entering radiation surface coil 59 of PH 74 through the first output 1 of SW and PA. During presence of the pulse at the output of CPG, the working frequency of CPG changes from f0 to f=f0+fIF, where fIF=10.7 MHz is the intermediate frequency of the receiving block, and the signal of CG enters through the second output 2 of SW and FM 62 control input of the receiving block. The same pulse of CPG opens PD 66 of the receiving block. So time separation of transmitting and receiving blocks functioning is performed, which protects the system from the false registration of the identified object due to infiltration of the transmitted signal at the receiving block input. Bringing of the label near the plane of the PH surface coil, there appears an FID signal (with envelope shown in FIG. 5) which through the receiving coil 61 of PH, HFA, FM, IFA enters PD, opened by the pulse of CPG. The output signal of PD is registered by RD and in such a way detection of the labeled object is performed. The one pulse sequence is repeated with the delay time 'DEL=10 $\mu$s being adjusted to gain the best signal to noise ratio (~130% for circular surface coil at 'DEL is greater or about of 0.05×$T_1$) where $T_1$=130 $\mu$s is the longitudinal relaxation time for the $^{55}Mn$ nucleus is powdered manganese ferrite at Earth's magnetic field and room temperature.

EXAMPLE 3

This example describes the construction of identification and/or authentication pulse performance system using re-radiating label with registration of spin echo signal (SES). Referring to FIG. 6, the system includes a transmitting block consisting of sequentially connected HFG 92, SW1 96, which the first output 97 is connected through HFPA 100 with RPH 102, which through SW2 98 is connected with the receiving block, consisting of sequentially connected ESA 104, PD 106, which control input is connected with the second output 107 of SW1, and the output of PD 106 is connected with RD 112 through LFA 108, CWD 110. Functioning of the transmitting and receiving blocks are controlled by CPG 94, whose first output 1 is connected with control input 95 of SW1, whose second output 2 is connected with control input 99 of SW2 98, and the third output 3 is connected with control input 111 of CWD 110. HFG 92 produces continuous harmonic high frequency signal, entering input of SW1. CPG produces special pulse sequence (FIG. 7), modulating the signal of SW1, from which the output sequence of radio pulses is amplified in HFPA 100, and enters RPH 102. During presence of the control pulse from CPG output, SW2 breaks connection between RPH 102 and the receiving block, so the signal emitted by transmitting block does not enter the receiving block. Further, as it is clear from FIG. 6, during presence of the pulse sequence, there are no reference signals at the control input 107 of PD, and CWD 110 is closed. All this provides protection of the system from the false registration of the identified object due to infiltration of the transmitted signal at the receiving block input. After the end of the specific pulse sequence SW1 and SW2 change their positions and the reference signal through SW1 enters the control input 107 of PD, and correspondingly, RPH signal enters ESA of the receiving block. However, this impulse from the third output 3 of CPG opens CWD 110. After two pulses of radiation the label re-radiates a spin echo signal (FIG. 7) which is registered by RD 112 of the receiving block and in such a way detection of the labeled object is performed. The two pulse sequence is repeated with the delay time being adjusted to prevent the saturation of SES (tDEL>5T1).

The invention relates to a method of labeling, authenticating and/or identifying a paper, credit/identification card, bank note, article or any other object using both nuclear magnetic resonance in magnetically ordered materials and nuclear quadrupole resonance phenomena as well as other phenomena of electric/magnetic dipole or tunnel transitions between Stark-Zeeman sub-levels, frequencies of which belong to the radio-frequency band. These methods being characterized in that a minor amount of at least one authenticating substance is added to the object, said substance having a strong, unique and identifiable response in radio-frequency domain at room temperature, with the spectroscopy being performed in the absence of any supported external static field, and with any specific response (intensity, line width, line shape, splittings, free induction decay, spin echoes or their combinations) being used as a criterion for discrimination. The spectroscopy is performed in time domain (pulse) or frequency domain (continuous wave) with or without intensity, polarization, frequency or any other modulation of the exciting electromagnetic field. The invention also provides instruments for implementing the method, and a set of substances usable with the method.

In order to provide secrecy of resonant properties of substances used, the substance can be a mixture of at least two modifications of the same chemical composition which exists in different structural phases (or isomorphs), with only one of them giving a response at the resonance frequency.

In order to provide secrecy of resonant properties, a substance may be used which gains its resonant properties at the resonance frequency only at the same time with local (at the point of said substance location) heating/cooling or magnetization/demagnetization.

We claim:

1. A method of labeling, authenticating and/or identifying an object using mixed electron nuclear resonances, comprising:
   applying a minor, labeling amount of at least one mixed electron nuclear resonant material to the object;
   providing a detection system emitting radio frequency energy in a non-cryogenic detecting volume, and spectroscopically detecting radio frequency responses from the detecting volume;
   placing the labeled object in the detecting volume for detection of the material without applying a static field in the detecting volume; and
   selecting for the material a substance resonating with a radio frequency response under non-cryogenic conditions, where the radio frequency response is large enough at zero external static field for a minor labeling amount of the selected substance to be detectable on the object.

2. A method as claimed in claim 1, wherein the detected response is nuclear magnetic resonance (NMR) in ferromagnets.

3. A method as claimed in claim 2, wherein said substance is a ferromagnetic metal, alloy, coordination or organic compound including at least one type of nuclei with non-zero nuclear spin.

4. A method as claimed in claim 3 and further comprising the step of deactivating the resonant properties by an alteration of physical properties of the substance.

5. A method as claimed in claim 3 and further comprising the step of deactivating the resonant properties by an alteration of chemical properties of the substance.

6. A method as claimed in claim 3 and further comprising the step of deactivating the resonant properties by electromagnetic screening of the resonant material.

7. A method as claimed in claim 3 and further comprising the step of deactivating the resonant properties by removing resonant material together with supported tag or adhesive label.

8. A method as claimed in claim 1, wherein the detected response is nuclear magnetic resonance (NMR) in antiferromagnets.

9. A method as claimed in claim 8, wherein said substance is an antiferromagnetic metal, alloy, coordination or organic compound including at least one type of nuclei with non-zero nuclear spin.

10. A method as claimed in claim 1, wherein the detected response is nuclear magnetic resonance (NMR) in ferrimagnets.

11. A method as claimed in claim 10, wherein said substance is a ferrimagnetic metal, alloy, coordination or organic compound including at least one type of nuclei with non-zero nuclear spin.

12. A method as claimed in claim 1, wherein the detected response is nuclear quadrupole resonance (NQR).

13. A method as claimed in claim 12, wherein said substance is metal, alloy, coordination or organic compound including at least one type of nuclei with non-zero electric quadrupole moment.

14. A method as claimed in claim 1, wherein the detected response is very low field electron spin resonance (VLF ESR).

15. A method as claimed in claim 14, wherein said substance is an organic radical compound.

16. A method as claimed in claim 14, wherein said substance is gamma-irradiated fused quartz.

17. A method as claimed in claim 14, wherein said substance is an inorganic salt or coordination compound containing paramagnetic ions of transition or rare earth groups.

18. A method as claimed in claim 1, wherein the detected response is due to electric/magnetic dipole or tunnel transitions between Stark-Zeeman sub levels.

19. A method as claimed in claim 18, wherein said substance is a coordination compound with mixed valence.

20. A method as claimed in claim 1, wherein the mixed electron nuclear resonant material includes at least two resonances selected from the group: nuclear magnetic resonance (NMR) of a ferromagnet, NMR of an antiferromagnet, NMR of a ferrimagnet, nuclear quadrupole resonance, very low field electron spin resonance, electric/magnetic dipole or tunnel transitions between Stark-Zeeman sublevels.

21. A method as claimed in claim 1, wherein said object is a paper, bank note, check, credit card, bank card, identification card, passport, tag, key, diskette or special adhesive label.

22. A method as claimed in claim 1, wherein said object is an article applied to an electronic product surveillance for theft prevention in shops, stores, or libraries.

23. A method as claimed in claim 1, wherein said object is a special tag, label or marker and the method is applied for personnel verification.

24. A method as claimed in claim 1, wherein said object is a document, jewel, firearm, explosive or drug, said method being applied for security or customs surveillance.

25. A method as claimed in claim 1, wherein said substance is a crystalline solid, polycrystalline solid, amorphous solid, wire, foil or liquid.

26. An instrument for implementing the method claimed in claim 1, which instrument comprises a probe head or coil, which probe head comprises means for continuous emission of radiation in the radio-frequency band in the detecting volume; and means for detecting radiation emitted or absorbed by the resonant substance in response to said radio-frequency radiation.

27. An instrument as claimed in claim 26, wherein said means for emitting radio-frequency radiation is arranged to emit pulses of radiation.

28. An instrument for implementing the method claimed in claim 1, which instrument comprises a gate which in use, will be located at a point of control in a shop, store, library, post office, airport or custom office which gate comprises means for continuous emission of radiation in the radio-frequency band in the detecting volume; and means for detecting radiation emitted by the resonant substance in response to said radio-frequency radiation.

29. An instrument claimed in claim 26 or 28, which instrument further comprises means for generating a modulated electromagnetic field in the detecting volume.

30. A method as claimed in claim 1, wherein a plurality of readable markers of the resonant substance, spatially disposed in a well-determined manner, are applied to the object.

31. A method as claimed in claim 30, wherein said method is applied together with other data storage methods for decoding information recorded by the other data storage methods.

32. An instrument for implementing the method claimed in claim 30, which instrument comprises a probe head or gate, which probe head comprises means for generating continuous or pulsed radiation, of at least one radio-frequency; means for detecting radiation emitted or absorbed by the resonant substance in response to said radio-frequency radiation; means for scanning said radiation or object spatially as well as means for analysis of spatially or spectrally distributed responses.

33. A method as claimed in claim 1, wherein said substance is introduced into ink, dye or glue before printing on the surface of an object to be labeled.

34. A method as claimed in claim 1, wherein said substance is introduced into the bulk of labeled object or its packaging material during object production or packaging.

35. A method as claimed in claim 1, wherein said substance is introduced in ink, dye or glue before covering the surface of labeled object.

36. A method as claimed in claim 1, wherein said substance is introduced locally or diffusely within a special adhesive label.

37. A method as claimed in claim 1, wherein said substance is visually masked.

38. A method as claimed in claim 1, further comprising the step of providing secrecy of resonant properties of substances used wherein said substance gains its resonant properties at the resonance frequency only in the presence of local heating/cooling or magnetization/demagnetization.

39. A method of labeling, authenticating and/or identifying an object using mixed electron nuclear resonances, comprising:

applying a minor, labeling amount of at least one mixed electron nuclear resonant material to the object;

providing a detection system emitting radio frequency energy in a non-cryogenic detecting volume, and spectroscopically detecting radio frequency responses from the detecting volume due to nuclear magnetic resonance (NMR) in ferromagnets formed of ferromagnetic metal, alloy, coordination organic compound including at least one type of nuclei with non-zero magnetic spin;

placing the labeled object in the detecting volume for detection of the material without applying a static field in the detecting volume; and selecting for the material a substance resonating with a radio frequency response under non-cryogenic conditions, where the radio frequency response is large enough at zero external static field for a minor labeling amount of the selected substance to be detectable on the object;

applying an LC resonance circuit on the object, the LC circuit having the same resonance frequency as the substance.

40. A method as recited in claim 39 wherein the applying is accomplished by covering the LC circuit with the resonating substance.

41. A method of labeling, authenticating and/or identifying an object using mixed electron nuclear resonances, comprising:

applying a minor, labeling amount of at least one mixed electron nuclear resonant material to the object;

providing a detection system with a probe head or coil continuously emitting radio frequency energy in a non-cryogenic detecting volume, and spectroscopically detecting radio frequency radiation emitted or absorbed from the detecting volume;

placing the labeled object in the detecting volume for detection of the material without applying a static field in the detecting volume;

selecting for the material a substance resonating with a radio frequency response under non-cryogenic conditions, where the radio frequency response is large enough at zero external static field for a minor labeling amount of the selected substance to be detectable on the object;

wherein the emitted radiation further includes emission at multiple non-working frequencies different than the resonant frequency, thereby masking the identity of the working resonant frequency.

42. A method of labeling, authenticating and/or identifying an object using mixed electron nuclear resonances, comprising:

applying a minor, labeling amount of at least one mixed electron nuclear resonant material to the object;

providing a detection system emitting radio frequency energy in a non-cryogenic detecting volume, and spectroscopically detecting radio frequency responses from the detecting volume;

placing the labeled object in the detecting volume for detection of the material without applying a static field in the detecting volume; and selecting for the material a substance resonating with a radio frequency response under non-cryogenic conditions, where the radio frequency response is large enough at zero external static field for a minor labeling amount of the selected substance to be detectable on the object; and providing a second, deactivating substance which combines chemically with the resonant substance to destroy its resonant properties and arranging the resonant substance for exposure to the second, deactivating substance upon unauthorized access to the resonant substance.

43. A method of labeling, authenticating and/or identifying an object using mixed electron nuclear resonances, comprising:

applying a minor, labeling amount of at least one mixed electron nuclear resonant material to the object;

providing a detection system emitting radio frequency energy in a non-cryogenic detecting volume, and spectroscopically detecting radio frequency responses from the detecting volume;

placing the labeled object in the detecting volume for detection of the material without applying a static field in the detecting volume; and selecting for the material a substance resonating with a radio frequency response under non-cryogenic conditions, where the radio frequency response is large enough at zero external static field for a minor labeling amount of the selected substance to be detectable on the object; and mixing the substance with a chemical isomorph which does not respond at the resonant frequency thereby providing secrecy of the resonant properties of the substance.

* * * * *